(12) United States Patent
Shiokawa (10) Patent No.: US 11,756,600 B2
(45) Date of Patent: Sep. 12, 2023

(54) SPIN-ORBIT TORQUE MAGNETIZATION ROTATIONAL ELEMENT, SPIN-ORBIT TORQUE MAGNETORESISTIVE EFFECT ELEMENT, AND MAGNETIC MEMORY

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 372 days.

(21) Appl. No.: 17/288,036

(22) PCT Filed: Feb. 6, 2019

(86) PCT No.: PCT/JP2019/004180
§ 371 (c)(1),
(2) Date: Apr. 23, 2021

(87) PCT Pub. No.: WO2020/161814
PCT Pub. Date: Aug. 13, 2020

(65) Prior Publication Data
US 2021/0383851 A1    Dec. 9, 2021

(51) Int. Cl.
*G11C 11/16* (2006.01)
*H10N 52/80* (2023.01)
(Continued)

(52) U.S. Cl.
CPC ........ *G11C 11/161* (2013.01); *G11C 11/1675* (2013.01); *G11C 11/18* (2013.01);
(Continued)

(58) Field of Classification Search
CPC ............... G11C 11/16; H10N 52/80
(Continued)

(56) References Cited

U.S. PATENT DOCUMENTS

| 8,350,347 B2 | 1/2013 | Gaudin et al. |
| 10,593,868 B2 | 3/2020 | Shiokawa et al. |

(Continued)

FOREIGN PATENT DOCUMENTS

| JP | 2017-199743 A | 11/2017 |
| JP | 2017-216286 A | 12/2017 |

(Continued)

OTHER PUBLICATIONS

K.Kato et al."OBSERVATION Of the Spin Hall Effect In Semiconductors".Science,vol. 306,Dec. 10, 2004,pp. 1910-1913.*
(Continued)

*Primary Examiner* — Muna A Techane
(74) *Attorney, Agent, or Firm* — Oliff PLC (57) ABSTRACT

A spin-orbit torque magnetization rotational element includes a first ferromagnetic layer and a spin-orbit torque wiring facing the first ferromagnetic layer and extending in a first direction. The spin-orbit torque wiring has a plurality of atomic planes in which atoms are arranged and the plurality of atomic planes have reference surfaces in which the same atoms are arranged and a buckling surface having a buckling part. The buckling surface has a plurality of first atoms forming a main surface substantially parallel to the reference surfaces and one or more second atoms forming a buckling part bent toward the main surface.

14 Claims, 6 Drawing Sheets

(51) Int. Cl.
  G11C 11/18 (2006.01)
  H01F 10/32 (2006.01)
  H10N 50/10 (2023.01)
  H10N 50/85 (2023.01)
  H10B 61/00 (2023.01)
(52) U.S. Cl.
  CPC ............ *H01F 10/329* (2013.01); *H10N 50/10* (2023.02); *H10N 50/85* (2023.02); *H10N 52/80* (2023.02); *H10B 61/00* (2023.02)
(58) Field of Classification Search
  USPC .......................................................... 365/158
  See application file for complete search history.

(56) References Cited

U.S. PATENT DOCUMENTS

| | | | |
|---|---|---|---|
| 2015/0348606 A1 | 12/2015 | Buhrman et al. | |
| 2016/0225423 A1* | 8/2016 | Naik | G11C 11/18 |
| 2017/0222135 A1 | 8/2017 | Fukami et al. | |
| 2018/0337326 A1 | 11/2018 | Sasaki | |
| 2018/0350417 A1* | 12/2018 | Shiokawa | G11B 5/39 |
| 2021/0151665 A1* | 5/2021 | Komura | G11C 11/161 |

FOREIGN PATENT DOCUMENTS

| | | |
|---|---|---|
| WO | 2016/021468 A1 | 2/2016 |
| WO | 2016/159017 A1 | 10/2016 |
| WO | 2017/090739 A1 | 6/2017 |

OTHER PUBLICATIONS

Seung Lee et al."Threshold Current for Switching OFA Perpendicular Magnetic Layer Induced By Spin Hall Effect".Applied Physics Letters,vol. 102,2013,pp. 1-17.*

Hunsuke Fukami et al."Magnetizations Witching By Spin-Orbit Torque in an Anti Ferromagnet-Erro Magnet By Layer System". Nature Materials,vol. 15,May 2016,pp. 535-542.*

Takahashi e tal."Spin In Jection and Detection in Magnetic Nano Structures".Physical Review ,vol. 67,2003, pp. 052409-1-052409-4.*

May 7, 2019 International Search Report issued in International Patent Application No. PCT/JP2019/004180.

Y.K. Kato et al. "Observation of the Spin Hall Effect in Semiconductors". Science, vol. 306, Dec. 10, 2004, pp. 1910-1913.

Ioan Mihai Miron et al. "Perpendicular Switching of a Single Ferromagnetic Layer Induced By In-Plane Current Injection". Nature, vol. 476, Aug. 11, 2011, pp. 189-194.

Luqiao Liu et al. "Spin Torque Switching With the Giant Spin Hall Effect of Tantalum". Science, vol. 336, 2012, pp. 1-19 and 1-12.

Luqiao Liu et al. "Current-Induced Switching of Perpendicularly Magnetized Magnetic Layers Using Spin Torque From the Spin Hall Effect". Physical Review Letters, vol. 109, 2012, pp. 096602-1-096602-5.

Ki-Seung Lee et al. "Threshold Current for Switching of a Perpendicular Magnetic Layer Nduced By Spin Hall Effect" Applied Physics Letters, vol. 102, 2013, pp. 1-17.

Ki-Seung Lee et al. "Thermally Activated Switching of Perpendicular Magnet By Spin-Orbit Spin Torque". Applied Physics Letters, vol. 104, 2014, pp. 072413-1-072413-5.

Shunsuke Fukami et al. "Magnetization Switching By Spin-Orbit Torque in an Antiferromagnet-Ferromagnet Bilayer System". Nature Materials, vol. 15, May 2016, pp. 535-542.

S. Fukami et al. "A Spin-Orbit Torque Switching Scheme With Collinear Magnetic Easy Axis and Current Configuration". Nature Nanotechnology, 2016, pp. 1-6.

S. Takahashi et al. "Spin Injection and Detection in Magnetic Nanostructures". Physical Review B, vol. 67, 2003, pp. 052409-1-052409-4.

Yeongkyo Seo et al. "Area-Efficient SOT-MRAM With a Schottky Diode". IEEE Electron Device Letters, vol. 37, No. 8, Aug. 2016, pp. 982-985.

W. Zhang et al. "Spin Hall Effects in Metallic Antiferromagnets". Physical Review Letters, vol. 113, Nov. 7, 2014, pp. 196602-1-196602-6.

* cited by examiner

SPIN-ORBIT TORQUE MAGNETIZATION ROTATIONAL ELEMENT, SPIN-ORBIT TORQUE MAGNETORESISTIVE EFFECT ELEMENT, AND MAGNETIC MEMORY

TECHNICAL FIELD

The present invention relates to a spin-orbit torque magnetization rotational element, a spin-orbit torque magnetoresistive effect element, and a magnetic memory.

BACKGROUND ART

Magnetoresistive effect elements are expected to be applied to magnetic sensors, high frequency components, magnetic heads, and non-volatile random access memories (MRAMs).

Magnetoresistive effect elements output change in direction of mutual magnetizations of two ferromagnetic layers having a non-magnetic layer arranged therebetween, as changes in resistance of devices. Magnetoresistive effect elements control the directions of magnetization of ferromagnetic layers and record data. As method for controlling a direction of magnetization, methods in which a magnetic field produced by a current is used and methods in which a spin transfer torque (STT) generated when a current flows in a direction in which a magnetoresistive effect element is stacked is used are known. In methods in which STTs are used, potential differences need to be provided in a direction of passing through non-magnetic layers, which may damage the non-magnetic layers in some cases.

In recent years, as new methods in which a direction of magnetization is controlled, methods in which a spin-orbit torque (SOT) is used have been studied (for example, Patent Document 1). SOTs are induced in ferromagnetic layers due to spin currents produced due to a spin-orbit interaction or the Rashba effect at interfaces between different kinds of materials. When SOTs act on the magnetizations in the ferromagnetic layers, the magnetizations are reversed. Spin currents and the Rashba effect occur if currents flow in directions intersecting directions in which ferromagnetic layers are stacked. In methods in which SOTs are used, it is possible to prevent large writing currents from flowing in directions in which non-magnetic layers and ferromagnetic layers are stacked and it is possible to minimize damage to non-magnetic layers and the like.

CITATION LIST

Patent Document

[Patent Document 1]
Japanese Unexamined Patent Application, First Publication No. 2017-216286

SUMMARY OF INVENTION

Technical Problem

Magnetic memories have a plurality of integrated magnetoresistive effect elements. If a reverse current density of each magnetoresistive effect element increases, the electric power consumption of magnetic memories increases. The reverse current density is a current density required for reversing the magnetization of the magnetoresistive effect element and the magnetoresistive effect element operates by reversing the magnetization. It is required to reduce the reverse current density of magnetoresistive effect elements and minimize the electric power consumption of magnetic memories.

The present invention was made in view of the above circumstances, and an object of the present invention is to provide a spin-orbit torque magnetization rotational element, a spin-orbit torque magnetoresistive effect element, and a magnetic memory in which a reverse current density can be reduced.

The reverse current density is reduced if the SOT can be efficiently applied to the magnetization of the ferromagnetic layer. The SOT is induced in the ferromagnetic layer due to, for example, a spin-orbit interaction, the Rashba effect, and the like. The inventors of the present invention have found that, if a buckling part is provided in a spin-orbit torque wiring, a spin-orbit interaction and the Rashba effect efficiently occur. That is to say, in order to achieve the above object, the following means are provided.

(1) A spin-orbit torque magnetization rotational element according to a first aspect includes: a first ferromagnetic layer; and a spin-orbit torque wiring facing the first ferromagnetic layer and extending in a first direction, wherein the spin-orbit torque wiring has a plurality of atomic planes in which atoms are arranged, the plurality of atomic planes have reference surfaces in which the same atoms are arranged and a buckling surface having a buckling part, and the buckling surface has a plurality of first atoms forming a main surface substantially parallel to the reference surfaces and one or more second atoms forming a buckling part bent toward the main surface.

(2) In the spin-orbit torque magnetization rotational element according to the above aspect, the atomic radius of each of the second atoms may be 1.1 times or more the atomic radius of each of the first atoms or 0.9 times or less the atomic radius of the first atoms.

(3) In the spin-orbit torque magnetization rotational element according to the above aspect, a length of a perpendicular line drawn from a center of the second atom to the main surface may be 0.5 times or more and 1.5 times or less an atomic radius of the first atom.

(4) In the spin-orbit torque magnetization rotational element according to the above aspect, the lattice spacing of the first atoms may be wider than the diameter of each of the second atoms.

(5) In the spin-orbit torque magnetization rotational element according to the above aspect, the first atoms may be the same as atoms mainly constituting the spin-orbit torque wiring.

(6) In the spin-orbit torque magnetization rotational element according to the above aspect, the first atoms may be different from atoms mainly constituting the spin-orbit torque wiring.

(7) In the spin-orbit torque magnetization rotational element according to the above aspect, a combination of the first atoms and the second atoms may include any selected from the group consisting Mo and Pd, Mo and Bi, Ru and Bi, Rh and Bi, Ag and Bi, Cd and Bi, W and Pd, W and Bi, Os and Bi, Ir and Bi, and Au and Bi.

(8) In the spin-orbit torque magnetization rotational element according to the above aspect, the buckling surface may be located on a first surface facing the first ferromagnetic layer.

(9) In the spin-orbit torque magnetization rotational element according to the above aspect, the spin-orbit torque wiring may have a first region facing the first ferromagnetic layer and a second region other than the first region, and the first region may have the buckling part.

(10) In the spin-orbit torque magnetization rotational element according to the above aspect, the second region may contain a hydrogen compound.

(11) In the spin-orbit torque magnetization rotational element according to the above aspect, the spin-orbit torque magnetization rotational element may include a plurality of the buckling surfaces.

(12) In the spin-orbit torque magnetization rotational element according to the above aspect, the spin-orbit torque wiring may contain any one or more atoms selected from the group consisting of Al, Cu, Si, Ag, Ga, and Ge.

(13) A spin current magnetoresistive effect element according to a second aspect includes: the spin-orbit torque magnetization rotational element according to the above aspect; a non-magnetic layer facing a surface of the first ferromagnetic layer opposite to the spin-orbit torque wiring; and a second ferromagnetic layer having the non-magnetic layer arranged between the first ferromagnetic layer and the second ferromagnetic layer.

(14) A magnetic memory according to a third aspect includes: a plurality of the spin-orbit torque magnetoresistive effect elements according to the above aspect.

Advantageous Effects of Invention

The spin-orbit torque magnetization rotational element, the spin-orbit torque magnetoresistive effect element, and the magnetic memory according to the above aspect can have reduced electric power consumption.

DESCRIPTION OF EMBODIMENTS

This embodiment will be described in detail below with reference to the drawings as appropriate. In the drawings used in the following description, enlarged characteristic parts may be illustrated for convenience for the sake of easy understanding of the features in some cases and dimensional ratios or the like of each constituent element may be different from the actual one in some cases. The materials, the dimensions, and the like provided in the following description are exemplary examples, the present invention is not limited thereto, and materials, dimensions, and the like can be implemented as appropriate within the range in which the effects of the present invention are achieved.

First, directions are defined. An x direction and a y direction are directions substantially parallel to a first surface 20a of a spin-orbit torque wiring 20 which will be described later. The x direction is a direction in which the spin-orbit torque wiring 20 which will be described later extends. The y direction is a direction which is orthogonal to the x direction. A z direction is a direction which is orthogonal to the x direction and the y direction. The x direction is an example of a first direction. Furthermore, the expression "extending in the x direction" in this specification means that, for example, the dimension in the x direction is larger than the smallest dimension among the dimensions in the x direction, the y direction, and the z direction. The same applies to the expression "extending in the other directions".

First Embodiment (Spin-Orbit Torque Magnetization Rotational Element)

Figure 1:
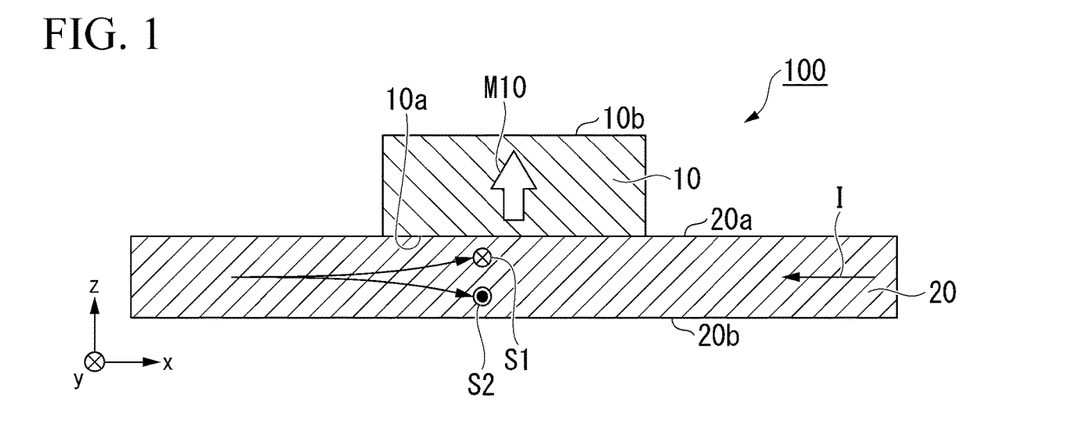
FIG. 1 is a schematic cross-sectional view of a spin-orbit torque magnetization rotational element according to a first embodiment.

FIG. 1 is a schematic cross-sectional view of a spin-orbit torque magnetization rotational element according to a first embodiment. A spin-orbit torque magnetization rotational element 100 includes a first ferromagnetic layer 10 and a spin-orbit torque wiring 20.

<First Ferromagnetic Layer>

The first ferromagnetic layer 10 has a first surface 10a and a second surface 10b. The first surface 10a faces the first surface 20a of the spin-orbit torque wiring 20. The term "facing" in this specification means that two surfaces substantially parallel to each other face each other. In addition, if two surfaces are in contact with each other, another layer may be arranged between the two surfaces. The second surface 10b is a surface opposite to the first surface 10a.

A cross section of the first ferromagnetic layer 10 illustrated in FIG. 1 is rectangular. The cross section of the first ferromagnetic layer 10 is not limited to a rectangular shape. The cross section of the first ferromagnetic layer 10 may be, for example, a trapezoidal shape in which lengths of the first surface 10a and the second surface 10b are different. Furthermore, a side surface connecting the first surface 10a to the second surface 10b may be curved.

Also, a planar shape of the first ferromagnetic layer 10 in the z direction is not particularly limited. The planar shape of the first ferromagnetic layer 10 is, for example, circular, elliptical, rectangular, or an irregular shape.

The first ferromagnetic layer 10 contains a ferromagnetic material, particularly, a soft magnetic material. Example of the ferromagnetic material includes metals selected from the group consisting of Cr, Mn, Co, Fe, and Ni, alloys containing one or more of these metals, alloys containing these metals and at least one or more elements from B, C, and N, and the like. Examples of the ferromagnetic material include Co—Fe, Co—Fe—B, Ni—Fe, Co—Ho alloys, Sm—Fe alloys, Fe—Pt alloys, Co—Pt alloys, and CoCrPt alloys.

The first ferromagnetic layer 10 may contain a Heusler alloy such as $Co_2FeSi$. The Heusler alloy contains an intermetallic compound having a chemical composition of XYZ or $X_2YZ$. X represents a Co-, Fe-, Ni-, or Cu-group transition metal element or noble metal element in the periodic table, Y represents a Mn-, V-, Cr-, or Ti-group transition metal or an element of the X type in the periodic table, and Z represents a typical element from Group III to Group V in the periodic table. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like. The Heusler alloy has a high spin polarizability.

The first ferromagnetic layer 10 has an easy axis of magnetization in any direction in an xy plane or in the z direction. When the first ferromagnetic layer 10 has the easy axis of magnetization in any direction in the xy plane, the first ferromagnetic layer 10 is referred to as an "in-plane magnetization film". When the first ferromagnetic layer 10 has the easy axis of magnetization in the z direction, the first ferromagnetic layer 10 is referred to as a "perpendicular magnetization film".

<Spin-Orbit Torque Wiring>

The spin-orbit torque wiring 20 extends in the x direction. The spin-orbit torque wiring 20 has the first surface 20a and a second surface 20b. The first surface 20a faces the first surface 10a of the first ferromagnetic layer 10. The second surface 20b is a surface opposite to the first surface 20a. Areas of the first surface 20a and the second surface 20b may be the same or different.

If a potential difference is provided at both ends of the spin-orbit torque wiring 20, a current I flows along the spin-orbit torque wiring 20. A first spin S1 oriented in one direction and a second spin S2 oriented in a direction opposite to that of the first spin S1 are each bent in a direction which is orthogonal to the current. For example, the first spin S1 oriented in a +y direction is bent in a +z direction and the second spin S2 oriented in a -y direction is bent in a -z direction.

The normal Hall effect and the spin Hall effect are the same in that a direction in which moving (traveling) electric charges (electrons) move (travel) is bent. On the other hand, the normal Hall effect and the spin Hall effect significantly differ in that the normal Hall effect causes a moving direction of charged particles moving in a magnetic field to be bent due to the charged particles receiving a Lorentz force, whereas the spin Hall effect causes a direction in which spins move to be bent only by moving electrons (only due to a current flowing) when a magnetic field does not exist.

In a non-magnetic material (a material which is not a ferromagnetic material), the number of electrons of the first spin S1 and the number of electrons of the second spin S2 produced due to the spin Hall effect are equal. In FIG. 1, the number of electrons of the first spin S1 directed in the +z direction and the number of electrons of the second spin S2 directed in the -z direction are equal. In this case, flows of electric charges cancel each other and an amount of current is zero. A spin current which does not accompany a current is particularly referred to as a "pure spin current".

If a flow of electrons of the first spin S1 is represented by $J_\uparrow$, a flow of electrons of the second spin S2 is represented by $J_\downarrow$, and a spin current is represented by $J_S$, they are defined by $J_S=J_\uparrow-J_\downarrow$. The spin current $J_S$ is produced in the z direction. In FIG. 1, the spin-orbit torque wiring 20 faces the first ferromagnetic layer 10. Spins are injected from the spin-orbit torque wiring 20 into the first ferromagnetic layer 10. The injected spins apply a spin-orbit torque (SOT) to the magnetization of the first ferromagnetic layer 10. The magnetization of the first ferromagnetic layer 10 is reversed due to the spin-orbit torque (SOT).

The spin-orbit torque wiring 20 is formed of any of metals, alloys, intermetallic compounds, metal borides, metal carbides, metal silicides, and metal phosphides having a function of producing a spin current due to the spin Hall effect when a current flows. The spin-orbit torque wiring 20 contains a material in which a spin-orbit torque (SOT) by which the magnetization of the first ferromagnetic layer 10 can be reversed is produced in the first ferromagnetic layer 10.

It is desirable that a main constitution of the spin-orbit torque wiring 20 contain a non-magnetic heavy metal. The heavy metal refers to a metal having a specific gravity equal to or higher than that of yttrium. It is desirable that the non-magnetic heavy metal be a non-magnetic metal having an outermost shell with d-electrons or f-electrons and having a large atomic number which is an atomic number of 39 or more. The non-magnetic heavy metal has a large spin-orbit interaction which causes the spin Hall effect to be produced.

Electrons generally move in a direction opposite to that of a current, regardless of a direction of spins thereof. On the other hand, this non-magnetic metal having an outermost shell with d-electrons or f-electrons and having a large atomic number has a large spin-orbit interaction and causes a strong spin Hall effect to be produced. The flow of spins in the z direction depends on a degree of uneven distribution of spins in the z direction. If a strong spin Hall effect is produced, the spins easily become unevenly distributed and the spin current $J_S$ is easily produced.

The spin-orbit torque wiring 20 may contain a magnetic metal. The magnetic metal is a ferromagnetic metal or an antiferromagnetic metal. A small amount of magnetic metal contained in the non-magnetic material serves as a cause of spin scattering. If the spins are scattered, the spin-orbit interaction is enhanced and the efficiency of spin current production with respect to the current increases. The major composition of the spin-orbit torque wiring 20 may one consisting of only an antiferromagnetic metal.

On the other hand, if an amount of magnetic metal added is increased too much, the produced spin current may be scattered due to the added magnetic metal, and as a result, the spin current may decrease in some cases. It is desirable that a molar ratio of the magnetic metal to be added be sufficiently smaller than a total molar ratio of the elements constituting the spin-orbit torque wiring. The molar ratio of the magnetic metal to be added is preferably 3% or less of the total of molar ratios.

The spin-orbit torque wiring 20 may contain a topological insulator. A topological insulator is a substance of which the inside is an insulator or a high resistance substance, but is a substance having a spin-polarized metallic state is present on a surface thereof. A topological insulator has an internal magnetic field produced due to a spin-orbit interaction. A topological insulator has a new topological phase which is exhibited due to the effect of a spin-orbit interaction when an external magnetic field does not exist. The topological insulator can produce a pure spin current with high efficiency due to a strong spin-orbit interaction and breakage of inversion symmetry at an edge.

Topological insulators include, for example, SnTe, $Bi_{1.5}Sb_{0.5}Te_{1.7}Se_{1.3}$, TlBiSe$_2$, Bi$_2$Te$_3$, Bi$_{1-x}$Sb$_x$, (Bi$_{1-x}$Sb$_x$)$_2$Te$_3$, and the like. The topological insulator can produce a spin current with high efficiency.

Figure 2:
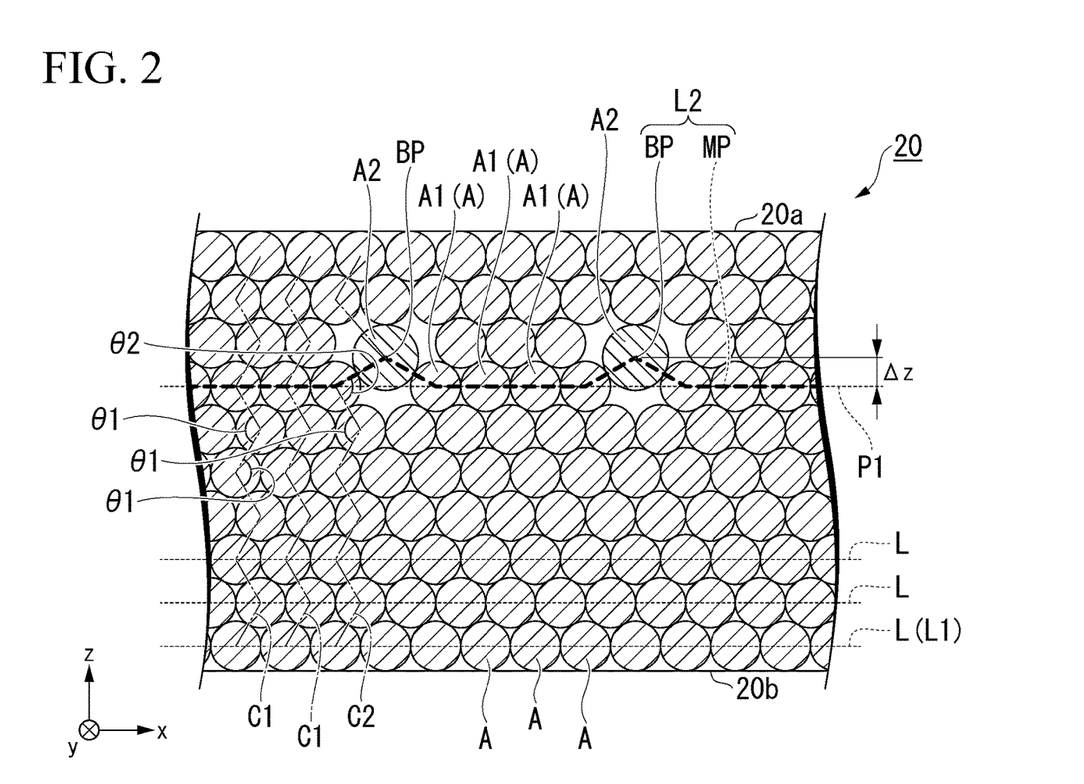
FIG. 2 is a schematic cross-sectional view of the spin-orbit torque wiring of the spin-orbit torque magnetization rotational element according to the first embodiment.

FIG. 2 is a schematic cross-sectional view of the spin-orbit torque wiring of the spin-orbit torque magnetization rotational element according to the first embodiment. The spin-orbit torque wiring 20 has a plurality of atomic planes L in which atoms are arranged. Each of the atomic planes L is a virtual plane obtained by connecting centers of the atoms arranged in the xy plane. The plurality of atomic planes L have reference surfaces L1 and a buckling surface L2.

Each of the reference surfaces L1 is a plane in which the same atoms A extend in the xy plane. The spin-orbit torque wiring 20 is stacked from the second surface 20b toward the first surface 20a. For this reason, the reference surfaces L1 are, for example, the atomic planes L located at positions which are the closest to the second surface 20b side of the spin-orbit torque wiring 20.

The buckling surface L2 has a main surface MP and a buckling part BP. The main surface MP is substantially parallel to the reference surfaces L1. A part of the main surface MP coincides with a parallel surface P1 substantially parallel to the reference surface L1. The main surface MP is composed of a plurality of first atoms A1. The buckling part BP bends with respect to the main surface MP. The buckling part BP is composed of second atoms A1. Here, buckling will be described.

The atoms A are stacked from the second surface 20b toward the first surface 20a. The atoms A are atoms forming the spin-orbit torque wiring 20. The atoms A are, for example, a non-magnetic heavy metal as described above in detail. The atoms A may contain any one or more atoms selected from the group consisting of Al, Cu, Si, Ag, Ga, and Ge.

In the xz plane, lines connecting the atoms A which are closest to each other in the z direction are defined as growth lines C1 and C2. The growth line C1 have regularity in the z direction. In the growth line C1 illustrated in FIG. 2, an internal angle θ1 of a line connecting neighboring atoms A is constant. On the other hand, in the growth line C2, the regularity of the internal angle of the line connecting the neighboring atoms A (the regularity in the z direction) is disturbed in the middle thereof. In the growth line C2 illustrated in FIG. 2, the internal angle θ1 of the line connecting the neighboring atoms A is constant in the middle thereof and changes to an internal angle θ2 at a certain portion. The internal angle θ2 is an internal angle at a position in which the regularity begins to be disturbed. The internal angle θ2 is, for example, 20% or more smaller than the internal angle θ1. If the internal angle θ1 is replaced by the internal angle θ2, the growth line C2 is significantly inclined with respect to the z direction. Significant disturbance of the regularity of the growth line C2 is referred to as buckling. If buckling occurs, each of the atomic planes L is also disturbed. As a result, the buckling surface L2 has the buckling part BP bent toward the parallel surface P1.

In FIG. 2, the buckling surface L2 is composed of the first atoms A1 and the second atoms A2. The buckling surface L2 is a virtual plane connecting centers of the first atoms A1 to centers of the second atoms A2. The main surface MP is a virtual plane connecting centers of the first atoms A1. The buckling part BP is a virtual plane connecting centers of the second atoms A2 to centers of the first atoms A1 adjacent to the second atoms A2.

In FIG. 2, the first atoms A1 are the same as the atoms A which mainly constitute the spin-orbit torque wiring. The first atoms A1 are, for example, a non-magnetic heavy metal.

In FIG. 2, each of the second atoms A2 is larger than each of the first atoms A1. The second atoms A2 cause the buckling surface L2 to bend with respect to the parallel surface P1 and cause the buckling part BP of the buckling surface L2. The second atom A2 is preferably 1.1 times or more an atomic radius of the first atom A1, and more preferably 1.2 times or more the atomic radius of the first atom A1. Furthermore, the second atom A2 is preferably 1.5 times or less the atomic radius of the first atom A1, and more preferably 1.4 times or less the atomic radius of the first atom A1.

Examples of a combination of the first atom A1 and the second atom A2 include Mo and Pd, Mo and Pr, Mo and Sm, Mo and Eu, Mo and Gd, Mo and Tb, Mo and Dy, Mo and Ho, Mo and Bi, Ru and Nb, Ru and Pr, Ru and Nd, Ru and Pm, Ru and Sin, Ru and Eu, Ru and Gd, Ru and Tb, Ru and Dy, Ru and Ho, Ru and Hf, Ru and Ta, Ru and Bi, Rh and Nb, Rh and Pr, Rh and Nd, Rh and Pm, Rh and Sm, Rh and Eu, Rh and Gd, Rh and Tb, Rh and Dy, Rh and Ho, Rh and Hff, Rh and Ta, Rh and W, Rh and Bi, Pd and Nb, Pd and Mo, Pd and Pr, Pd and Nd, Pd and Pm, Pd and Sm, Pd and Eu, Pd and Gd, Pd and Tb, Pd and Dy, Pd and Ho, Pd and Hf, Pd and Ta, Pd and W, Pd and Re, Pd and Bi, Ag and Nb, Ag and Mo, Ag and Ce, Ag and Pr, Ag and Nd, Ag and Pm, Ag and Sm, Ag and Eu, Ag and Gd, Ag and Tb, Ag and Dy, Ag and Ho, Ag and Hf, Ag and Ta, Ag and W, Ag and Re, Ag and Bi, Cd and Nb, Cd and Mo, Cd and Ru, Cd and Ce, Cd and Nd, Cd and Pm, Cd and Sm, Cd and Eu, Cd and Gd, Cd and Tb, Cd and Dy, Cd and Ho, Cd and Hf, Cd and Ta, Cd and W, Cd and Re, Cd and Ir, Cd and Bii, Hf and Rh, Hf and Pd, HF and Ce, Hf and Pr, Hf and Sm, Hf and Eu, Hf and Gd, Hf and Re, Hf and Ir, Hf and Pt, Hf and Au, Hf and Bi, Ta and Rh, Ta and Pd, Ta and Pr, Ta and Sm, Ta and Eu, Ta and Gd, Ta and Tb, Ta and Dy, Ta and Ho, Ta and Ir, Ta and Pt, Ta and Au, Ta and Bi, W and Rh, W and Pd, W and Pr, W and Sm, W and Eu, W and Gd, W and Tb, W and Dy, W and Ho, W and Au, W and Bi, OS and Pr, Os and Nd, Os and Pm, Os and Sm, Os and Ru, Os and Gd, Os and Tb, Os and Dy, Os and Ho, Os and Hf, Os and Bi, Ir and Nb, Ir and Pr, Ir and Sm, Ir and Eu, Ir and Gd, Ir and Tb, Ir and Dy, Ir and Ho, Ir and Hf, Ir and Ta, Ir and Bi, Pt and Nb, Pt and Pr, Pt and Sm, Pt and Eu, Pt and Gd, Pt and Tb, Pt and Dy, Pt and Ho, Pt and Hf, Pt and Ta, Pt and Bi, Au and Nb, Au and Pr, Au and Sm, Au and Eu, Au and Gd, Au and Tb, Au and Dy, Au and Ho, Au and Hf, Au and Ta, Au and W, and Au and Bi. It is desirable that the combination of the first atom A1 and the second atom A2 be any selected from the group consisting of Mo and Pd, Mo and Bi, Ru and Bi, Rh and Bi, Ag and Bi, Cd and Bi, W and Pd, W and Bi, Os and Bi, Ir and Bi, and Au and Bi. The first atom A1 is an atom having a smaller atomic radius of the atoms of the combination.

A height position of the second atoms A2 in the z direction is different from a height position of the first atoms A1 in the z direction. A difference Δz between these height positions is a length of a perpendicular line drawn from the center of the second atom A2 to the main surface MP (the parallel surface P1). The difference Δz between these height positions is preferably 0.5 times or more and 1.5 times or less the radius of the first atom A1. The difference Δz between these height positions is more preferably 0.64 times or more the radius of the first atom A1, and further preferably 1.0 times or more the radius of the first atom A1. Furthermore, the difference Δz between these height positions is preferably 0.8 Å or more, and more preferably 1.4 Å or more.

Figure 3:
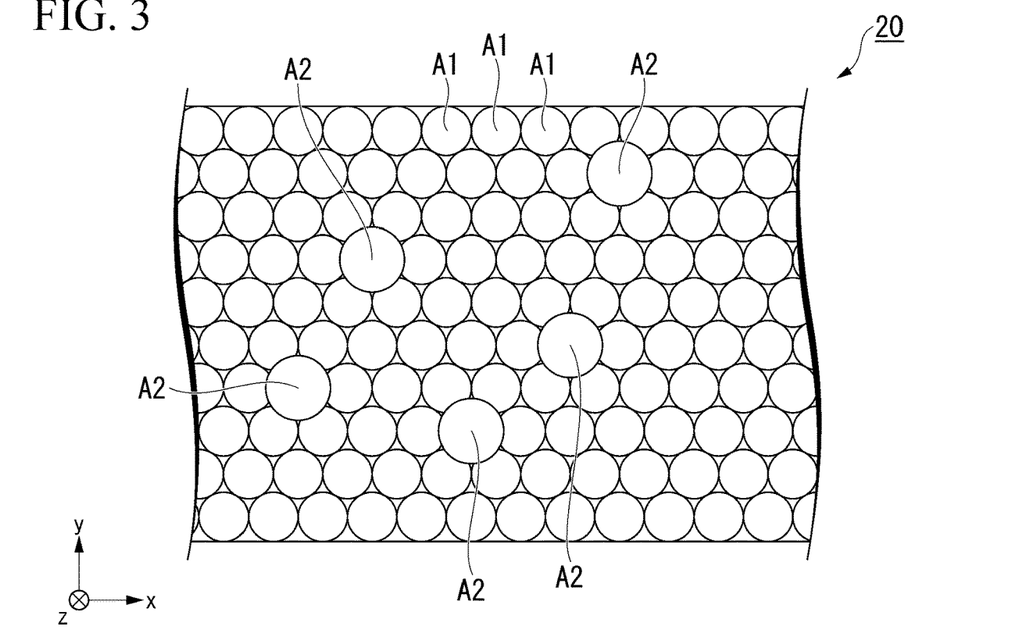
FIG. 3 is a schematic plan view of a buckling surface of the spin-orbit torque wiring of the spin-orbit torque magnetization rotational element according to the first embodiment.

FIG. 3 is a schematic plan view of a buckling surface of the spin-orbit torque wiring of the spin-orbit torque magnetization rotational element according to the first embodiment. The second atoms A2 are a part of the buckling surface L2 and exist, as points, above the first atoms A1 which are regularly arranged. The second atoms A2 are, for example, randomly located in the xy plane.

The buckling part BP can be confirmed using, for example, a high-resolution scanning transmission electron microscope (STEM). The position of each atom is specifically identified by irradiating a measurement sample sliced to about 50 nm with electrons and forming an image using electrons transmitted through or scattered in the measurement sample. Furthermore, an image of high-angle scattered electrons may be formed using a high-angle scattered annular dark-field scanning transmission microscope (HAADF-STEM). The HAADF-STEM can obtain a contrast proportional to the atomic weight and can measure a difference between the atoms in the buckling part BP with a high contrast.

The buckling part BP can also be measured using, for example, surface measurement in which a positron beam is used. The buckling surface L2 is caused to be exposed and the buckling surface is irradiated with a positron beam at a low angle. It is possible to evaluate a state of the buckling surface L2 from a diffraction image of the scattered electrons. Furthermore, X-rays and neutron beams may be used instead of a positron beam.

<Production Method>

An example of a production method for the spin-orbit torque magnetization rotational element 100 will be described.

First, a spin-orbit torque wiring 20 is formed above a substrate (not shown). A layer which is the spin-orbit torque wiring 20 is stacked using, for example, a sputtering method. Above the substrate, ions which will be converted into the atoms A are sputtered and ions which will be converted into the second atoms A2 are sputtered while the processing is being performed. The second atoms A2 are sputtered under low energy conditions. For example, an accelerating voltage when the second atoms A2 are sputtered is lower than that when only the atoms A are sputtered. Furthermore, for example, a gas flow rate of a rare gas or the like when the second atoms A2 are sputtered is increased as compared with when only the atoms A are sputtered. When the gas flow rate is increased, a sputtering rate of the second atoms A2 decreases. Furthermore, the second atoms A2 may be sputtered on a surface on which a film is to be formed in an oblique direction. If the sputtering is performed in the oblique direction, a difference between flying and arrival times of the ions occurs and the second atoms A2 exist, as points, above the first atoms A1. Furthermore, instead of a sputtering method, an electron beam vapor deposition method (EB deposition method) or an atomic laser deposition method may be used. The spin-orbit torque wiring 20 is obtained by processing the layer which is the spin-orbit torque wiring 20 through photolithography and the like.

Subsequently, the circumference of the spin-orbit torque wiring 20 is covered with an insulating layer. The insulating layer is, for example, an oxide film, a nitride film, or the like.

Subsequently, the surfaces of the insulating layer and the spin-orbit torque wiring are planarized through chemical mechanical polishing (CMP). Moreover, a layer which is the first ferromagnetic layer 10 is stacked on the planarized surfaces. Finally, the first ferromagnetic layer 10 is processed using a technique, such as photolithography. The first ferromagnetic layer 10 and the spin-orbit torque wiring 20 may be processed at the same time.

In the spin-orbit torque magnetization rotational element 100 according to this embodiment, the spin Hall effect and the Rashba effect efficiently occur in the spin-orbit torque wiring 20. For this reason, the SOT acts efficiently on the magnetization M10 of the first ferromagnetic layer 10 and a reverse current density can be reduced.

The reason why the spin current and the Rashba effect efficiently occur if the spin-orbit torque wiring 20 has the buckling part BP will be described.

The buckling part BP is a portion in which a crystal structure is disturbed and causes electrons flowing through the inside of the spin-orbit torque wiring 20 in the x direction to scatter. The spin Hall effect is a phenomenon in which spins oriented in one direction are bent in a direction orthogonal to that of a current (that is, toward an outer circumference of the spin-orbit torque wiring 20). If electrons (spins) are scattered due to the buckling part BP, the scattered electrons (spins) are directed in the z direction and the spin Hall effect is efficiently produced. The spin Hall effect produces uneven distribution of spins in the vicinity of the first surface 20a and the second surface 20b. A spin current occurs in a direction in which uneven distribution of spins is eliminated. When the uneven distribution of the spins in the first surface 20a and the second surface 20b increases, a spin current more easily occurs.

On the other hand, if there are too many sources of scattering in the spin-orbit torque wiring 20, the occurred spin current may be scattered. For this reason, an amount of spins injected into the first ferromagnetic layer 10 decreases and an SOT does not act efficiently on the magnetization M10.

The buckling part BP is a minute disturbance of atomic arrangement which occurs at a thickness corresponding to a level, such as one atomic layer. Unlike large strains and crystal defects, the buckling part BP does not cause excessive scattering. The buckling part BP enhances the production efficiency of the spin Hall effect, which does not significantly inhibit a spin current. Therefore, in the spin-orbit torque magnetization rotational element 100 according to this embodiment, many spins can be injected into the first ferromagnetic layer 10 and an SOT can be efficiently caused to act on the magnetization M10 of the first ferromagnetic layer 10.

The detailed mechanism of the Rashba effect is not clear, but is considered as follows. The Rashba effect is a phenomenon in which a potential gradient is formed in the z direction due to the breaking of the spatial inversion symmetry and directions of spins are aligned. If a current flows in the x direction in the spin-orbit torque wiring 20 in which there is a potential gradient in the z direction, an effective magnetic field is produced in the z direction perpendicular to a direction in which electrons move (the x direction). The effective magnetic field acts on the spins and the directions of the spins are aligned in the direction of this effective magnetic field.

The buckling part BP disturbs an electron state of the spin-orbit torque wiring 20. The buckling part BP breaks the symmetry of an electron state in the z direction. The buckling part BP creates the electric field effect in the spin-orbit torque wiring 20 and creates a level split. The breaking of the symmetry of the electron state creates the effective magnetic field and causes spins to be oriented. As a result, spins in the vicinity of the first surface 20a and the second surface 20b are unevenly distributed. The uneven distribution of the spins produces a spin current.

The buckling part BP creates a slight disturbance in the crystal structure and does not significantly change the electron state of the spin-orbit torque wiring 20. If the electron state changes significantly, a level split is created and the Rashba effect cannot efficiently occur.

As described above in detail, in the spin-orbit torque magnetization rotational element 100 according to the first embodiment, even if a current I with a small current density flows through the spin-orbit torque wiring 20 due to the buckling part BP, many spins can be injected into the first ferromagnetic layer 10. Therefore, in the spin-orbit torque magnetization rotational element 100 according to the first embodiment, it is possible to reduce a reverse current density required for reversing the magnetization M10 of the first ferromagnetic layer 10.

Although an example of the spin-orbit torque magnetization rotational element 100 according to the first embodiment has been described in detail above, additions, omissions, replacements, and other changes of the constitutions are possible without departing from the gist of the present invention.

First Modified Example

Figure 4:
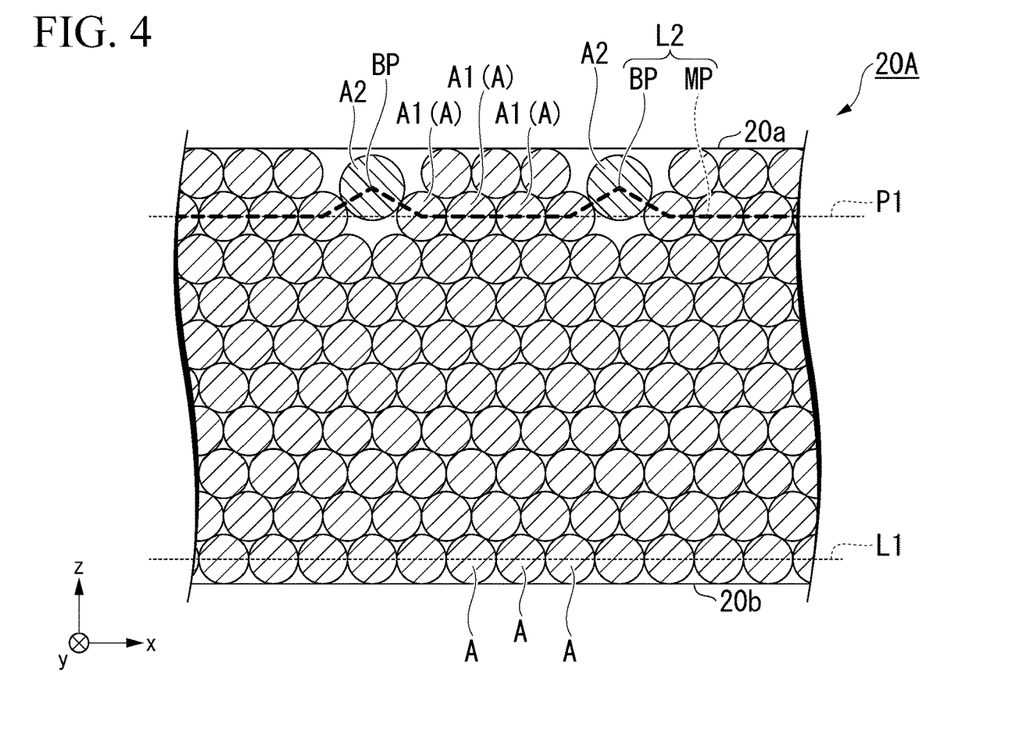
FIG. 4 is a schematic cross-sectional view of a spin-orbit torque wiring in a first modified example of the spin-orbit torque magnetization rotational element according to the first embodiment.

FIG. 4 is a schematic cross-sectional view of a spin-orbit torque wiring in a first modified example of the spin-orbit torque magnetization rotational element according to the first embodiment. A spin-orbit torque wiring 20A illustrated in FIG. 4 and the spin-orbit torque wiring 20 illustrated in FIG. 2 differ in that a buckling surface L2 in the spin-orbit torque wiring 20A is located on a first surface 20*a*. Constituent elements of FIG. 4 that are the same as those of FIG. 2 will be denoted by the same reference symbols and a description thereof will be omitted.

The Rashba effect easily occurs at an interface between different kinds of materials. When the buckling surface L2 is provided in the vicinity of the first surface 20*a*, it is possible to further enhance the production efficiency of the Rashba effect. Furthermore, the first surface 20*a* is a surface which faces the first surface 10*a* of the first ferromagnetic layer 10. When the Rashba effect occurs in the vicinity of the first surface 20*a* near the first ferromagnetic layer 10, it is possible to enhance the injection efficiency of spins into the first ferromagnetic layer 10.

Second Modified Example

Figure 5:
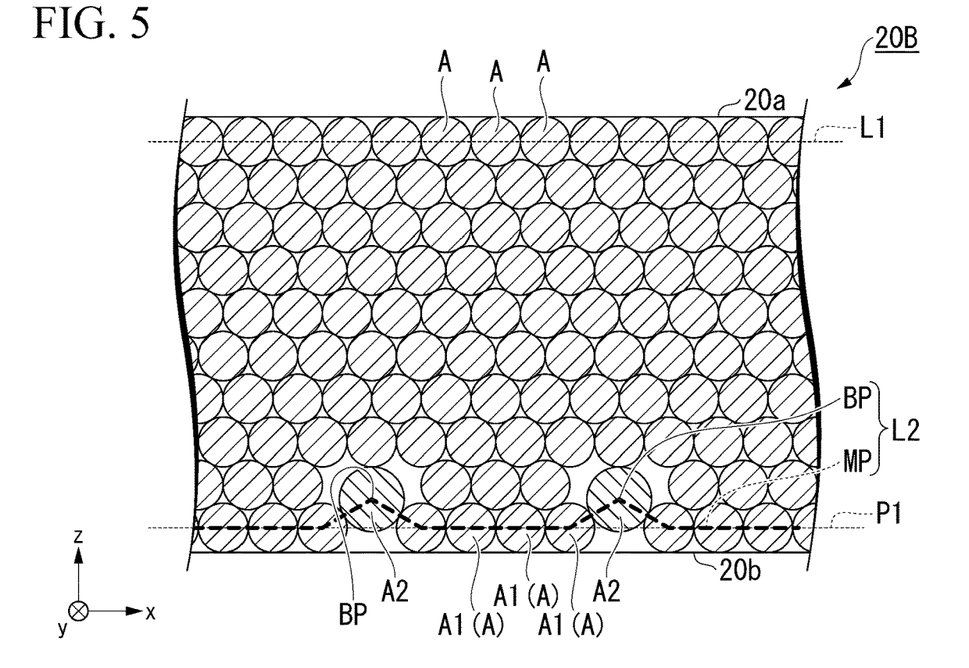
FIG. 5 is a schematic cross-sectional view of a spin-orbit torque wiring of a second modified example of the spin-orbit torque magnetization rotational element according to the first embodiment.

FIG. 5 is a schematic cross-sectional view of a spin-orbit torque wiring of a second modified example of the spin-orbit torque magnetization rotational element according to the first embodiment. A spin-orbit torque wiring 20B illustrated in FIG. 5 and the spin-orbit torque wiring 20 illustrated in FIG. 2 differ in that a buckling surface L2 in the spin-orbit torque wiring 20B is located on a second surface 20*b*. Constituent elements in FIG. 5 that are the same as those of FIG. 2 will be denoted by the same reference symbols and a description thereof will be omitted.

The Rashba effect easily occurs at an interface between different types of interfaces. When the buckling surface L2 is provided in the vicinity of the second surface 20*b*, it is possible to further enhance the production efficiency of the Rashba effect. When the buckling surface L2 is located on the second surface 20*b*, the reference surfaces L1 is, for example, an atomic plane L located at positions which are the closest to the first surface 20*a* side of the spin-orbit torque wiring 20.

Third Modified Example

Figure 6:
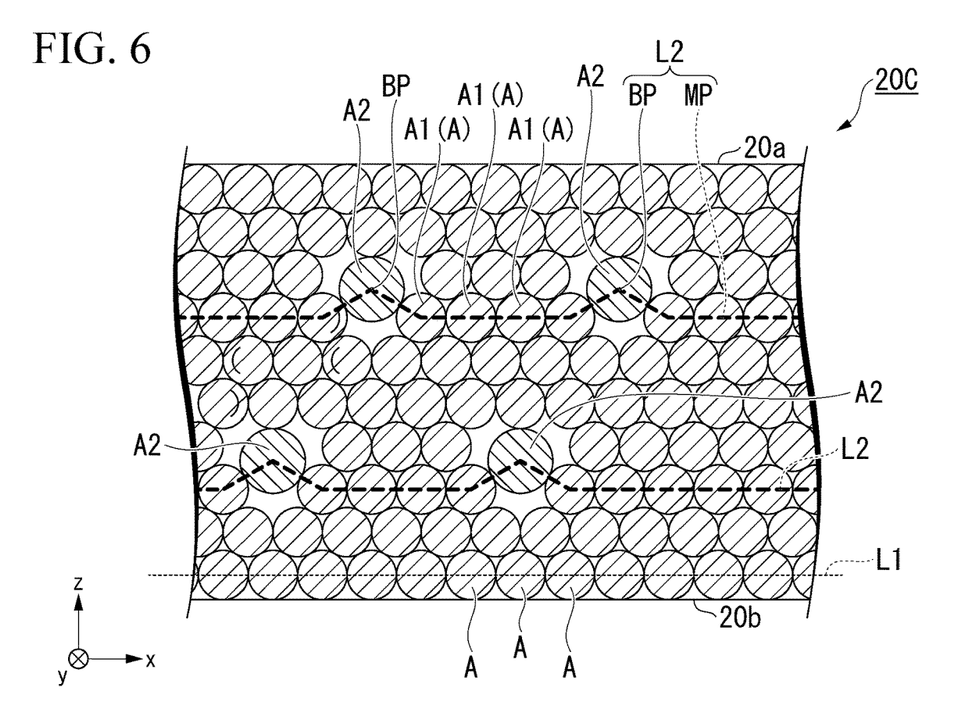
FIG. 6 is a schematic cross-sectional view of a spin-orbit torque wiring of a third modified example of the spin-orbit torque magnetization rotational element according to the first embodiment.

FIG. 6 is a schematic cross-sectional view of a spin-orbit torque wiring of a third modified example of the spin-orbit torque magnetization rotational element according to the first embodiment. A spin-orbit torque wiring 20C illustrated in FIG. 6 and the spin-orbit torque wiring 20 illustrated in FIG. 2 differ in that the spin-orbit torque wiring 20C has two layers of buckling surfaces L2. Constituent elements in FIG. 6 that are the same as those of FIG. 2 will be denoted by the same reference symbols and a description thereof will be omitted.

The number of buckling surfaces L2 which exist in the spin-orbit torque wiring 20 is not particularly limited. The number of buckling surfaces L2 may one as illustrated in FIG. 2, two as illustrated in FIG. 6, or three or more.

Also, the spin-orbit torque wiring 20 and the spin-orbit torque wirings 20A, 20B, and 20C are all stacked in the z direction by shifting positions of atoms A in the x direction (cubic close packing), in which the positions of the atoms A in the x direction may match.

Second Embodiment

Figure 7:
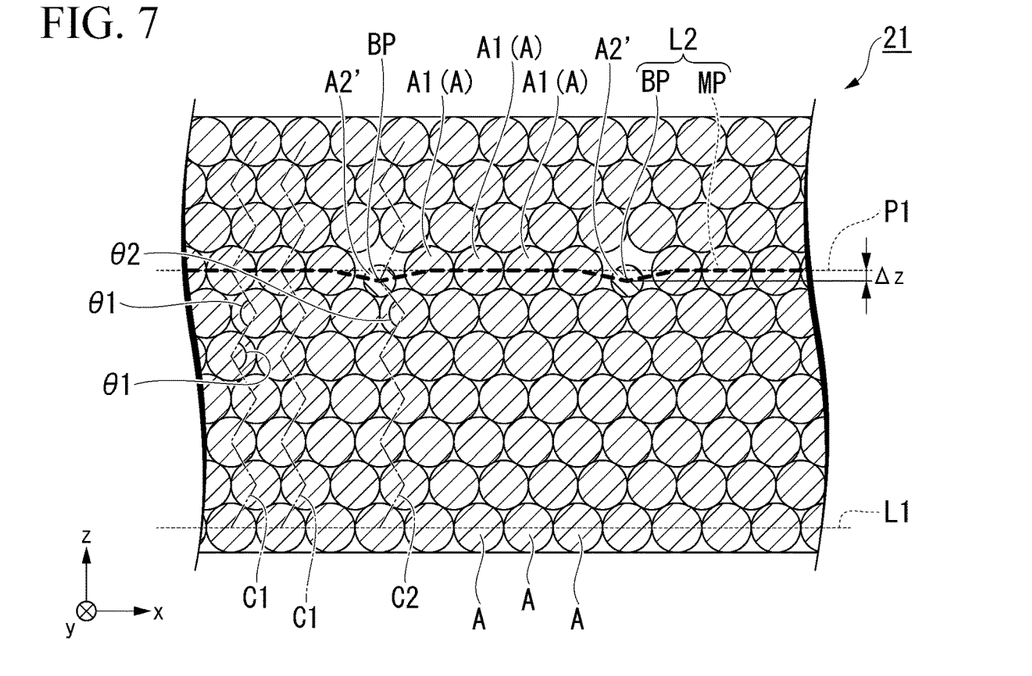
FIG. 7 is a schematic cross-sectional view of a spin-orbit torque magnetization rotational element according to a second embodiment.

FIG. 7 is a schematic cross-sectional view of a spin-orbit torque wiring of a spin-orbit torque magnetization rotational element according to a second embodiment. A spin-orbit torque wiring 21 illustrated in FIG. 7 and the spin-orbit torque wiring 20 according to the first embodiment differ in that second atoms A2' in the spin-orbit torque wiring 21 is smaller than first atoms A1. Constituent elements in FIG. 7 that are the same as those of FIG. 2 will be denoted by the same reference symbols and a description thereof will be omitted.

Even when each of the second atoms A2' are smaller than each of the first atoms A1, a buckling surface L2 is bent toward a parallel surface P1 and the buckling surface L2 has a buckling part BP.

The second atom A2' is preferably 0.9 times or less an atomic radius of the first atom A1 and more preferably 0.83 times or less the atomic radius of the first atom A1. Furthermore, the second atom A2' is preferably 0.66 times or more the atomic radius of the first atom A1 and more preferably 0.71 times or more the atomic radius of the first atom A1.

It is desirable that a combination of the first atom A1 and the second atom A2 be the same as the combination described in the first embodiment, in which the first atom A1 is an atom having a larger atomic radius of the atoms of the combination. Furthermore, it is desirable that a lattice spacing of the first atoms A1 be wider than diameters of the second atoms A2. The lattice spacing of the first atoms A1 is a distance between centers of the first atoms A1 which are closest to each other.

Also, it is desirable that a difference Δz between a height position of the second atoms A2 in the z direction and a height position of the first atoms A1 in the z direction be within the same range as in the difference Δz described in the first embodiment.

Since the spin-orbit torque wiring 21 of the spin-orbit torque magnetization rotational element according to the second embodiment has the buckling part BP, the same effect as that of the spin-orbit torque magnetization rotational element 100 according to the first embodiment can be obtained. Furthermore, the same modified example as that of the first embodiment can be also applied to the spin-orbit torque magnetization rotational element according to the second embodiment.

Third Embodiment

Figure 8:
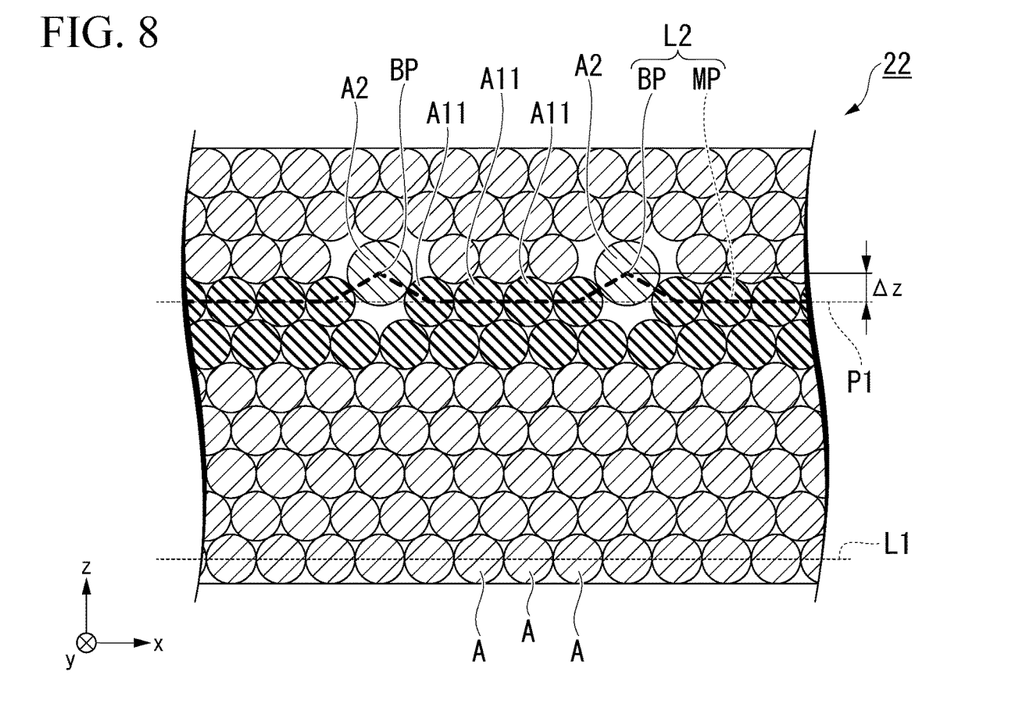
FIG. 8 is a schematic cross-sectional view of a spin-orbit torque wiring of a spin-orbit torque magnetization rotational element according to a third embodiment.

FIG. 8 is a schematic cross-sectional view of a spin-orbit torque wiring of a spin-orbit torque magnetization rotational element according to a third embodiment. A spin-orbit torque wiring 22 illustrated in FIG. 8 and the spin-orbit torque wiring 20 according to the first embodiment differ in that first atoms A11 constituting a buckling surface L2 in the spin-orbit torque wiring 22 is different from the atoms A mainly constituting the spin-orbit torque wiring 22. Constituent elements in FIG. 8 that are the same as those of FIG. 2 will be denoted by the same reference symbols and a description thereof will be omitted.

The buckling surface L2 is composed of the first atoms A11 and second atoms A2. The buckling surface L2 is a virtual plane obtained by connecting centers of the first atoms A11 to centers of the second atoms A2. A main surface MP is a virtual plane obtained by connecting the centers of the first atoms A11. A buckling part BP is a virtual plane obtained by connecting the second atoms A2 to the first atoms A11 adjacent to the second atoms A2.

The first atoms A11 is different from the atoms A mainly constituting the spin-orbit torque wiring 22. Examples of the atoms A include a non-magnetic heavy metal. Each of the first atoms A11 is, for example, Mo, Ru, Rh, Pd, Ag, Cd, Hf, Ta, W, OS, Ir, Pt, and Au. Furthermore, the atoms A may be, for example, a spin conductive material through which a spin current is easily transmitted. Examples of the first atoms A11 include Al, Si, Cu, Ga, and Ge.

Each of the second atoms A2 illustrated in FIG. 8 is larger than each of the first atoms A11. The second atoms A2 cause the buckling surface L2 to bend with respect to the main surface MP and cause the buckling part BP of the buckling surface L2. The second atom A2 is preferably 1.1 times or more an atomic radius of the first atom A11 and more preferably 1.2 times or more the atomic radius of the first atom A11. Furthermore, the second atom A2 is preferably 1.5 times or less the atomic radius of the first atom A11 and more preferably 1.4 times or less the atomic radius of the first atom A11.

Also, each of the second atoms A2 may be smaller than each of the first atoms A11. The second atom A2 is preferably 0.9 times or less the atomic radius of the first atom A11 and more preferably 0.83 times or less the atomic radius of the first atom A11. Furthermore, the second atom A2 is preferably 0.66 times or more the atomic radius of the first atom A11 and more preferably 0.7 times or more the atomic radius of the first atom A11.

A combination of the first atom A11 and the second atom A2 is, for example, as follows. For example, it is desirable that the first atom A11 be any selected from the group consisting of Al, Si, Cu, Ga, Ge, Mo, Ru, Rh, Pd, Ag, Cd, Hf, Ta, W, Os, Ir, Pt, and Au and the second atom A2 be any selected from the group consisting of Nb, Mo, Ru, Rh, Pd, Ce, Pr, Nd, Pm, Sm, Eu, Gd, Tb, Dy, Ho, Hf, Ta, W, Re, Ir, Pt, Au, and Bi. In the above combination, the first atom A11 may be one of the atoms and the second atom A2 may be the other atom thereof.

Since the spin-orbit torque wiring 22 of the spin-orbit torque magnetization rotational element according to the third embodiment has the buckling part BP, the same effect as that of the spin-orbit torque magnetization rotational element 100 according to the first embodiment can be obtained. Furthermore, the first atoms A11 in the spin-orbit torque magnetization rotational element according to the third embodiment is different from the atoms A mainly constituting the spin-orbit torque wiring 22. For this reason, interfaces of difference atoms increase in the spin-orbit torque wiring 22. The Rashba effect easily occurs at an interface between different types of interfaces. Therefore, more spins can be injected into the first ferromagnetic layer 10 and it is possible to further reduce a reverse current density required for reversing the magnetization M10 of the first ferromagnetic layer 10.

The same modified example as that of the first embodiment can be also applied to the spin-orbit torque magnetization rotational element according to the third embodiment.

Fourth Embodiment

Figure 9:
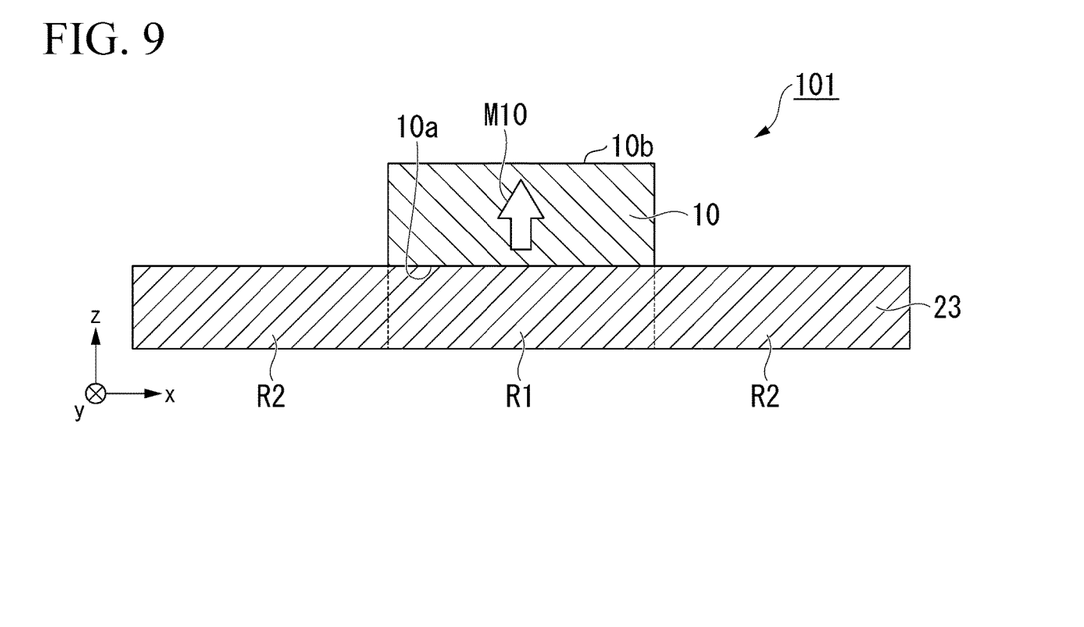
FIG. 9 is a schematic cross-sectional view of a spin-orbit torque magnetization rotational element according to a fourth embodiment.

FIG. 9 is a schematic cross-sectional view of a spin-orbit torque wiring of a spin-orbit torque magnetization rotational element according to a fourth embodiment. A spin-orbit torque magnetization rotational element 101 illustrated in FIG. 9 and the spin-orbit torque magnetization rotational element 100 according to the first embodiment differ in that a spin-orbit torque wiring 23 in the spin-orbit torque magnetization rotational element 101 has a first region R1 and a second region R2. Constituent elements in FIG. 9 that are the same as those of FIG. 1 will be the same reference symbols and a description thereof will be omitted.

The spin-orbit torque wiring 23 has the first region R1 and the second region R2. The first region R1 is a portion facing a first ferromagnetic layer 10 and is a portion in which the spin-orbit torque wiring 23 and the first ferromagnetic layer 10 overlap when viewed in a plan view from the z direction. When areas of a first surface 10a and a second surface 10b differ, the first region R1 is a portion in which the spin-orbit torque wiring 23 and the first surface 10a overlap when viewed in a plan view from the z direction. The second region R2 is a portion of the spin-orbit torque wiring 23 excluding the first region R1.

The first region R1 has the buckling part BP (refer to FIG. 2). The second region R2 may have a buckling part BP. Spins are injected from the first region R1 into the first ferromagnetic layer 10. When the buckling part BP is provided in the first region R1, it is possible to enhance the injection efficiency of spins into the first ferromagnetic layer 10.

Also, the second region R2 contains a hydrogen compound. A concentration of the hydrogen compound in the second region R2 is higher than a concentration of a hydrogen compound in the first region R1. The first region R1 may not have the hydrogen compound. The hydrogen compound is, for example, a compound in which the spin-orbit torque wiring 23 and ammonia have reacted, a compound in which the spin-orbit torque wiring 23 and a hydrocarbon have reacted, or the like. The concentrations of the hydrogen compounds in the first region R1 and the second region R2 correspond to a concentration in a first surface 23a of the spin-orbit torque wiring 23. The concentration of the hydrogen compound in the first region R1 is evaluated at a position in which centers of gravity of the first ferromagnetic layer 1 and the spin-orbit torque wiring 23 overlap when viewed in a plan from the z direction. The concentration of the hydrogen compound in the second region R2 is evaluated at a center position of the center of gravity of the first ferromagnetic layer 1 and an end portion of the spin-orbit torque wiring 23 when viewed in a plan from the z direction.

Figure 10:
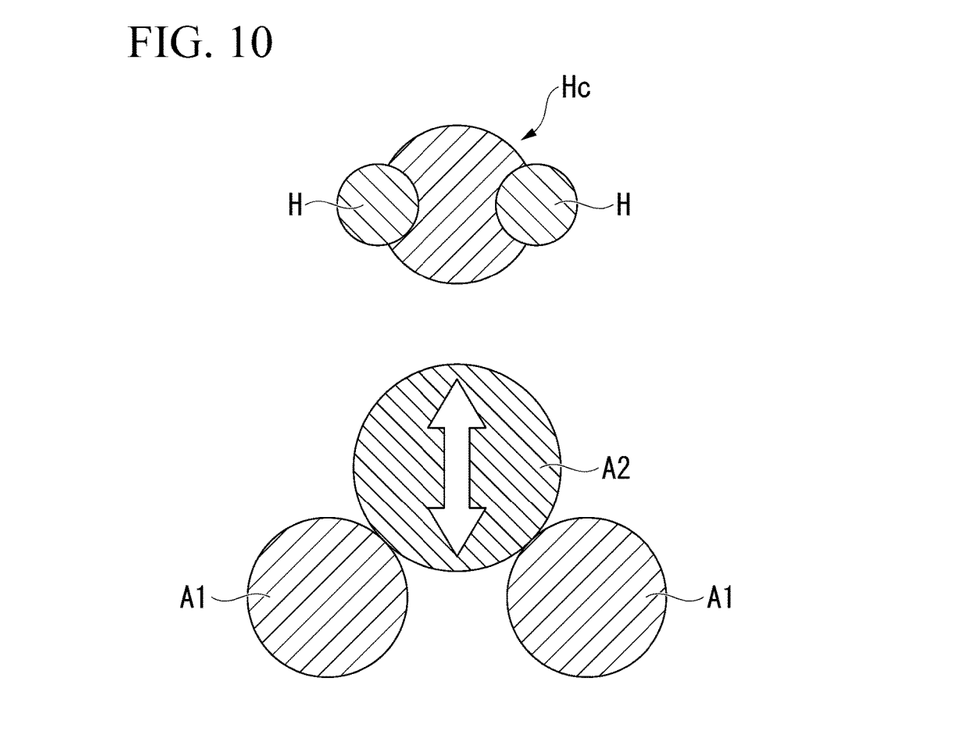
FIG. 10 is a schematic diagram of a relationship between second atoms and a hydrogen compound.

The hydrogen compound has strong molecular-atomic bonds. If hydrogen atoms of the hydrogen compound ionically bond with the second atoms A2 forming the buckling part BP, atomic positions of the second atoms A2 change. FIG. 10 is a schematic diagram of a relationship between the second atoms A2 and a hydrogen compound Hc. The hydrogen compound Hc ionically bonds with the second atoms A2. Binding energy of ionic bonding is different from that of metallic bonding. The second atoms A2 move due to the ionic bonding in a direction in which the second atoms A2 go toward the hydrogen compound Hc or a direction in which the second atoms A2 go away from the hydrogen compound Hc.

If atomic positions of the second atoms A2 fluctuate, the symmetry of the electron state in the z direction is further broken. As a result, a more significant level split of the spin-orbit torque wiring 20 is produced and the Rashba effect occurs more efficiently. Therefore, more spins can be injected into the first ferromagnetic layer 10 and it is possible to further reduce a reverse current density required for reversing the magnetization M10 of the first ferromagnetic layer 10.

When the first ferromagnetic layer 10 is processed into a prescribed shape using photolithography, if reactive ion etching (RIE) is performed using a hydrogen compound, such as ammonia or a hydrocarbon, the hydrogen compound is introduced into the second region R2.

As an example, the concentration of the hydrogen compound of the first surface 23a of the spin-orbit torque wiring 23 in the second region R2 is higher than the concentration of the hydrogen compound at a center of the spin-orbit torque wiring 23 in the z direction.

Since the spin-orbit torque magnetization rotational element 101 according to the fourth embodiment has the buckling part BP, the same effect as that of the spin-orbit torque magnetization rotational element 100 according to the first embodiment can be obtained. Furthermore, it is possible to efficiently achieve the Rashba effect using the hydrogen compound Hc and inject more spins into the first ferromagnetic layer 10. Therefore, in the spin-orbit torque magnetization rotational element 101 according to the fourth embodiment, it is possible to further reduce a reverse current density required for reversing the magnetization M10 of the first ferromagnetic layer 10.

The spin-orbit torque magnetization rotational element according to the fourth embodiment can be also applied to the constitution of any of the same modified examples as those of the first embodiment, the second embodiment, and the third embodiment.

Fifth Embodiment (Spin-Orbit Torque Magnetoresistive Effect Element)

Figure 11:
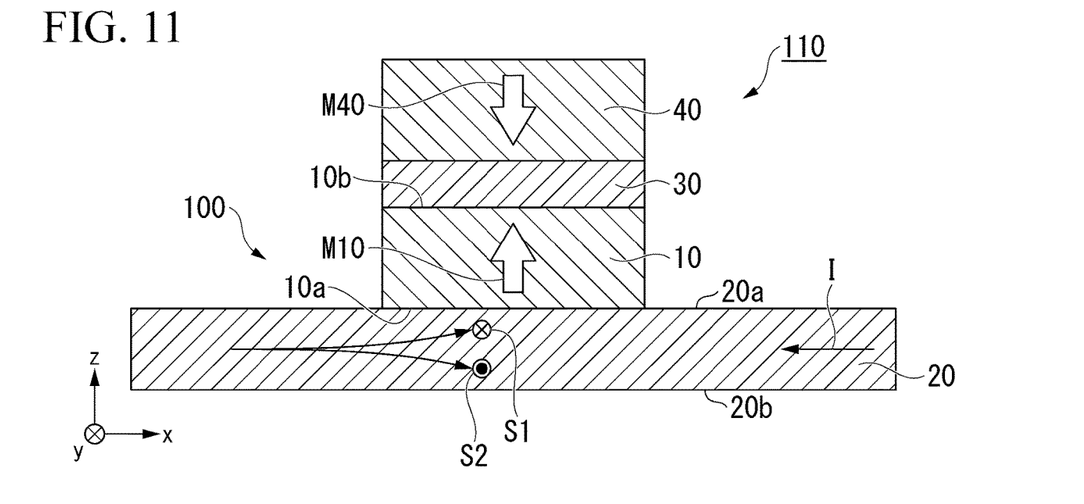
FIG. 11 is a schematic cross-sectional view of a spin current magnetoresistive effect element according to a fifth embodiment.

FIG. 11 is a schematic cross-sectional view of a spin-orbit torque magnetoresistive effect element 110 according to a fifth embodiment. The spin-orbit torque magnetoresistive effect element 110 illustrated in FIG. 11 includes a spin-orbit torque magnetization rotational element 100, a non-magnetic layer 30, and a second ferromagnetic layer 40. Although the spin-orbit torque magnetization rotational element 100 according to the first embodiment has been used as a spin-orbit torque magnetization rotational element in FIG. 11, the spin-orbit torque magnetization rotational elements according to the second to fourth embodiment may be also used. A description of a constituent element in FIG. 11 that is the same as the spin-orbit torque magnetization rotational element 100 in the first embodiment will be omitted.

A laminate obtained by stacking the first ferromagnetic layer 10, the non-magnetic layer 30, and the second ferromagnetic layer 40 is the same as a normal magnetoresistive effect element. In the laminate, the magnetization M40 of the second ferromagnetic layer 40 is fixed in one direction (the z direction) and a direction of the magnetization M10 of the first ferromagnetic layer 10 changes relatively. When the laminate is a coercive force difference type (pseudo spin valve type) magnetoresistive effect element, the coercive force of the second ferromagnetic layer 40 is made larger than the coercive force of the first ferromagnetic layer 10. When the laminate is an exchange bias type (spin valve type) magnetoresistive effect element, the magnetization M40 of the second ferromagnetic layer 40 is fixed to the first ferromagnetic layer 10 by subjecting the second ferromagnetic layer 40 to an interlayer antiferromagnetic (SAF) coupling.

The laminate has the same constitution as a tunneling magnetoresistance (TMR) element when the non-magnetic layer 30 is formed of an insulator and has the same constitution as a giant magnetoresistance (GMR) element when the non-magnetic layer 30 is formed of a metal.

The laminate may have layers other than the first ferromagnetic layer 10, the non-magnetic layer 30, and the second ferromagnetic layer 40. The laminate may have, for example, an underlayer, a cap layer, or the like in which the crystallinity of the laminate is enhanced. The underlayer is formed between the spin-orbit torque wiring 20 and the first ferromagnetic layer 10. The cap layer is formed on an upper surface of the laminate.

The same material as the first ferromagnetic layer 10 can be used for the second ferromagnetic layer 40.

The non-magnetic layer 30 is formed of a non-magnetic insulator, a semiconductor, or a metal. Examples of the non-magnetic insulator include $Al_2O_3$, $SiO_2$, MgO, $MgAl_2O_4$, and materials in which a part of Al, Si, and Mg thereof is replaced with Zn, Be, or the like. When the non-magnetic layer 30 is formed of the non-magnetic insulator, the non-magnetic layer 30 is a tunnel barrier layer. MgO and $MgAl_2O_4$ can easily realize a coherent tunnel between the first ferromagnetic layer 10 and the second ferromagnetic layer 40. Examples of the non-magnetic metal include Cu, Au, Ag, and the like. In addition, examples of the non-magnetic semiconductor include Si, Ge, $CuInSe_2$, $CuGaSe_2$, Cu(In, $Ga)Se_2$, and the like.

The spin-orbit torque magnetoresistive effect element 110 according to the fifth embodiment records and reads out data using a change in resistance value occurring due to a difference between relative angles of the magnetization M10 of the first ferromagnetic layer 10 and the magnetization M40 of the second ferromagnetic layer 40.

Since the spin-orbit torque magnetoresistive effect element 110 according to the fifth embodiment has the buckling part BP, the same effect as that of the spin-orbit torque magnetization rotational element 100 according to the first embodiment can be obtained.

Sixth Embodiment (Magnetic Memory)

Figure 12:
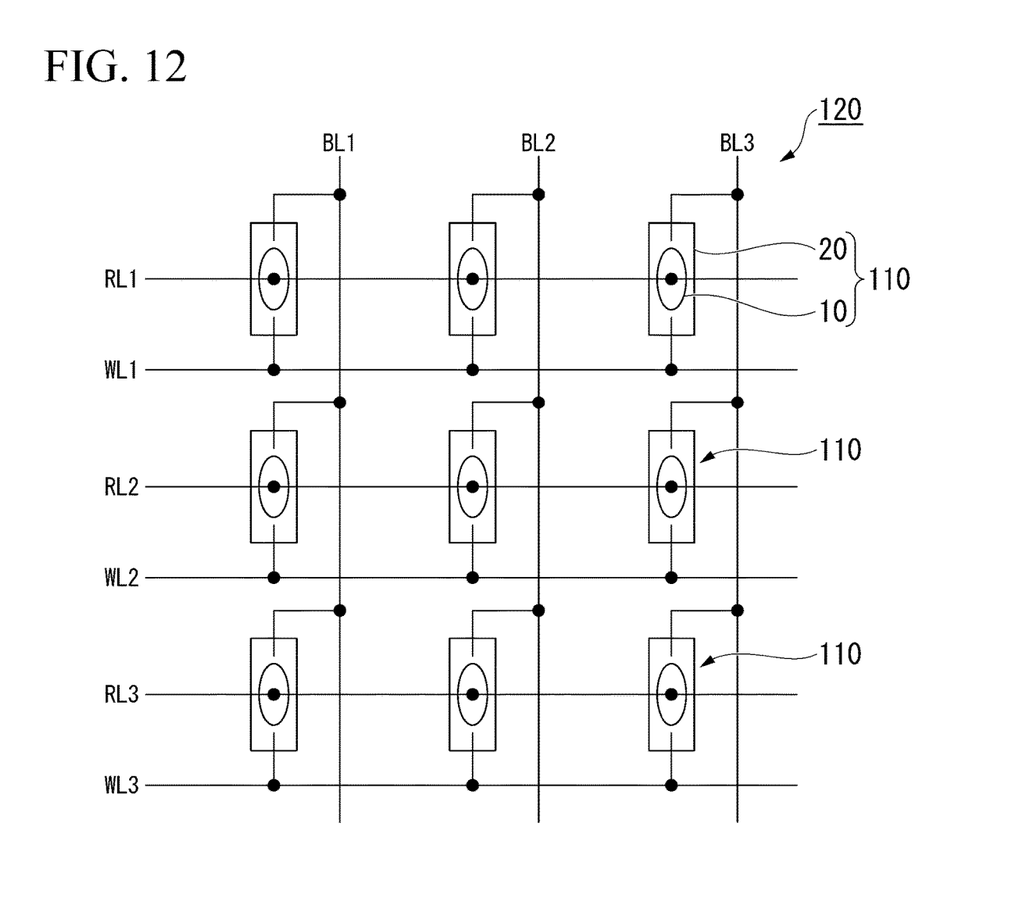
FIG. 12 is a schematic circuit diagram of a magnetic memory according to a sixth embodiment.

FIG. 12 is a schematic diagram of a magnetic memory according to a sixth embodiment. A magnetic memory 120 includes a plurality of spin-orbit torque magnetoresistive effect elements 110 (refer to FIG. 11).

The magnetic memory 120 illustrated in FIG. 12 includes the spin-orbit torque magnetoresistive effect elements 110 arranged into a 3×3 matrix shape. FIG. 12 is an example of the magnetic memory and the number and arrangement of the spin-orbit torque magnetoresistive effect elements 110 are arbitrary.

One of word lines WL1 to WL3, one of bit lines BL1 to BL3, and one of read lines RL1 to RL3 are connected to each of the spin-orbit torque magnetoresistive effect elements 110.

When each of the word lines WL1 to WL3 and each of the bit lines BL1 to BL3 to which a current is applied are selected, a writing operation is performed by flowing a current through a spin-orbit torque wiring 20 of any of the spin-orbit torque magnetoresistive effect elements110. Furthermore, when each of the read lines RL1 to RL3 and each of the bit lines BL1 to BL3 to which a current is applied are selected, a reading operation is performed by flowing a current through any of the spin-orbit torque magnetoresistive effect elements 110 in a direction in which the spin-orbit torque magnetoresistive effect elements 110 are stacked. Each of the word lines WL1 to WL3, each of the bit lines BL1 to BL3, and each of the read lines RL1 to RL3 to which a current is applied can be selected using a transistor or the like. That is to say, when data of any element is read out from the plurality of spin-orbit torque magnetoresistive effect elements 110, the spin-orbit torque magnetoresistive effect elements 110 can be utilized as a magnetic memory.

REFERENCE SIGNS LIST

10 First ferromagnetic layer
20, 20A, 20B, 20C, 21, 22, 23 Spin-orbit torque wiring
10a, 20a First surface
10b, 20b Second surface
100, 101 Spin-orbit torque magnetization rotational element
110 Spin-orbit torque magnetoresistive effect element
120 Magnetic memory
A Atom
A1, A11 First atom
A2, A2' Second atom
BP Buckling part
C1, C2 Growth line
Hc Hydrogen compound
I Current
L Atomic plane
L1 Reference surface
L2 Buckling surface
M10, M40 Magnetization
MP Main surface
P1 Parallel surface
S1 First spin
S2 Second spin

What is claimed is:

1. A spin-orbit torque magnetization rotational element, comprising:
   a first ferromagnetic layer; and
   a spin-orbit torque wiring facing the first ferromagnetic layer and extending in a first direction,
   wherein the spin-orbit torque wiring has a plurality of atomic planes in which atoms are arranged,
   the plurality of atomic planes have reference surfaces in which the same atoms are arranged and a buckling surface having a buckling part, and
   the buckling surface has a plurality of first atoms forming a main surface substantially parallel to the reference surfaces and one or more second atoms forming a buckling part bent toward the main surface.

2. The spin-orbit torque magnetization rotational element according to claim 1, wherein an atomic radius of each of the second atoms is 1.1 times or more an atomic radius of each of the first atoms or 0.9 times or less the atomic radius of the first atoms.

3. The spin-orbit torque magnetization rotational element according to claim 1, wherein a length of a perpendicular line drawn from a center of the second atom to the main surface is 0.5 times or more and 1.5 times or less an atomic radius of the first atom.

4. The spin-orbit torque magnetization rotational element according to claim 1, wherein a lattice spacing of the first atoms is wider than a diameter of each of the second atoms.

5. The spin-orbit torque magnetization rotational element according to claim 1, wherein the first atoms are the same as atoms mainly constituting the spin-orbit torque wiring.

6. The spin-orbit torque magnetization rotational element according to claim 1, wherein the first atoms are different from atoms mainly constituting the spin-orbit torque wiring.

7. The spin-orbit torque magnetization rotational element according to claim 1, wherein a combination of the first atoms and the second atoms includes any selected from the group consisting Mo and Pd, Mo and Bi, Ru and Bi, Rh and Bi, Ag and Bi, Cd and Bi, W and Pd, W and Bi, Os and Bi, Ir and Bi, and Au and Bi.

8. The spin-orbit torque magnetization rotational element according to claim 1, wherein the buckling surface is located on a first surface facing the first ferromagnetic layer.

9. The spin-orbit torque magnetization rotational element according to claim 1, wherein the spin-orbit torque wiring has a first region facing the first ferromagnetic layer and a second region other than the first region, and
   the first region has the buckling part.

10. The spin-orbit torque magnetization rotational element according to claim 9, wherein the second region contains a hydrogen compound.

11. The spin-orbit torque magnetization rotational element according to claim 1, comprising:
   a plurality of the buckling surfaces.

12. The spin-orbit torque magnetization rotational element according to claim 1, wherein the spin-orbit torque wiring contains any one or more atoms selected from the group consisting of Al, Cu, Si, Ag, Ga, and Ge.

13. A spin-orbit torque magnetoresistive effect element, comprising:
   the spin-orbit torque magnetization rotational element according to claim 1;
   a non-magnetic layer facing a surface of the first ferromagnetic layer opposite to the spin-orbit torque wiring; and
   a second ferromagnetic layer having the non-magnetic layer arranged between the first ferromagnetic layer and the second ferromagnetic layer.

14. A magnetic memory, comprising:
   a plurality of the spin-orbit torque magnetoresistive effect elements according to claim 13.

* * * * *